US007988529B2

(12) United States Patent
Chandrasekaran et al.

(10) Patent No.: US 7,988,529 B2
(45) Date of Patent: Aug. 2, 2011

(54) METHODS AND TOOLS FOR CONTROLLING THE REMOVAL OF MATERIAL FROM MICROFEATURE WORKPIECES

(75) Inventors: Nagasubramaniyan Chandrasekaran, Boise, ID (US); Rajshree Kothari, Boise, ID (US); Gundu M. Sabde, Boise, ID (US); James J. Hofmann, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 302 days.

(21) Appl. No.: 12/410,984

(22) Filed: Mar. 25, 2009

(65) Prior Publication Data

US 2009/0181601 A1 Jul. 16, 2009

Related U.S. Application Data

(63) Continuation of application No. 11/511,689, filed on Aug. 28, 2006, now Pat. No. 7,527,545.

(51) Int. Cl.
*B24B 7/22* (2006.01)
*B24B 49/12* (2006.01)

(52) U.S. Cl. ............................................. 451/6; 451/41

(58) Field of Classification Search .................. 451/6, 7, 451/5, 287, 288, 41
See application file for complete search history.

(56) References Cited

U.S. PATENT DOCUMENTS

| 6,489,624 B1 | 12/2002 | Ushio et al. |
| 6,511,363 B2 | 1/2003 | Yamane et al. |
| 2002/0127950 A1 | 9/2002 | Hirose et al. |

FOREIGN PATENT DOCUMENTS

EP 1341223 A1 9/2003

OTHER PUBLICATIONS

Abdi, H., Partial Least Squares (PLS) Regression, in M. Lewis-Beck, A. Bryman, T. Futing (Eds): *Encyclopedia for research methods for the social sciences.* Thousand Oaks (CA): Sage. pp. 792-795, 2003.
Boulesteix, Anne-Laure and Korbinian Strimmer, "Partial least squares: a versatile tool for the analysis of high-dimensional genomic data," Briefings in Bioinformatics, vol. 8, No. 1, pp. 32-44, Oxford University Press, May 26, 2006.
International Search Report and Written Opinion issued Dec. 3, 2007 in International Application No. PCT/US2007/074845.

*Primary Examiner* — Robert Rose
(74) *Attorney, Agent, or Firm* — Perkins Coie LLP

(57) ABSTRACT

Methods and apparatus for controlling the removal of material from microfeature workpieces in abrasive removal processes. An embodiment of such a method comprises irradiating a periodic structure of the workpiece and obtaining an intensity distribution of radiation returning from the periodic structure. The workpiece can be irradiated with a wide spectrum of wavelengths (e.g., white light), or the workpiece can be irradiated with a laser or lamp at specific wavelengths. The intensity distribution can be an image or other signal from which a dimension or other physical parameter of the periodic structure can be determined. For example, the intensity distribution can be an intensity signal of radiation returning from the workpiece in a selected bandwidth (e.g., 200 nm-900 nm) or an image of a diffraction pattern of radiation that has been scattered by the periodic structure. The method further includes outputting a control signal based on the obtained intensity distribution. For example, the control signal can be an endpoint signal indicating the actual endpoint of the abrasive removal process.

22 Claims, 6 Drawing Sheets

METHODS AND TOOLS FOR CONTROLLING THE REMOVAL OF MATERIAL FROM MICROFEATURE WORKPIECES

CROSS-REFERENCE TO RELATED APPLICATION

This application is a continuation of U.S. application Ser. No. 11/511,689 filed Aug. 28, 2006, which is incorporated herein by reference in its entirety.

TECHNICAL FIELD

The present invention is directed generally to methods and tools for removing material from microfeature workpieces using abrasive processes.

BACKGROUND

Mechanical planarization, chemical-mechanical planarization (CMP), polishing, backgrinding, and other abrasive removal processes remove materials from microfeature workpieces at many stages in the production of microelectronic devices. In such abrasive removal processes, an abrasive medium abrades material from the surface of a microfeature workpiece either with or without chemicals. Conventional planarizing or polishing processes are often performed on machines that have a rotary platen, a planarizing pad on the platen, and a carrier assembly for pressing a workpiece against the planarizing pad. To planarize a workpiece, the carrier assembly rotates and translates the workpiece across the surface of the planarizing pad while the platen rotates the planarizing pad. A planarizing solution is generally deposited onto the planarizing pad while the workpiece rubs against the pad surface. The planarizing solution may be a slurry with abrasive particles and chemicals that etch and/or oxidize the surface of the workpiece, or the planarizing solution may be a clean non-abrasive planarizing solution without abrasive particles.

Abrasive removal processes must consistently and accurately produce a uniformly planar surface on the workpiece to enable precise fabrication of circuits and photo-patterns. A non-uniform surface can result, for example, when materials from certain areas of the workpiece are removed more quickly than materials from other areas during processing. In the highly competitive semiconductor industry, it is also desirable to maximize the throughput of such processes by producing a planar surface on a substrate as quickly as possible. This is a function, at least in part, of the ability to accurately stop the process at a desired endpoint. In a typical application, the desired endpoint is reached when the surface of the substrate is planar and/or when enough material has been removed from the substrate to form discrete components (e.g., shallow trench isolation structures, contacts, damascene lines, and other features). Accurately stopping the removal of material at a desired endpoint is important for maintaining a high throughput and good yield because a workpiece may need to be repolished if it is "under-planarized," or the workpiece may be destroyed or otherwise impaired if it is "over-polished." Thus, it is highly desirable to stop abrasive processing at the desired endpoint.

One conventional method for endpointing planarization processes is to estimate the polishing rate or polishing period based upon polishing identical substrates under the same conditions. The estimated polishing period for a particular substrate, however, may not be accurate because the polishing rate and other variables may change from one substrate to another and as other parameters change over time. Thus, this method may not produce accurate results. Another method for estimating the endpoint involves removing the substrate from the pad and measuring a change in thickness of a film on the substrate. Removing the substrate from the pad, however, interrupts the planarizing process and may damage the substrate. Thus, this method generally reduces the throughput of CMP processing. Yet another procedure to estimate the endpoint is to measure changes in the friction or drag force between the workpiece and the planarizing pad during the planarizing cycle. The drag force is affected by the type of material at the surface of the workpiece, and thus the drag force changes as different materials are exposed during a planarizing cycle. Such friction-based endpoint procedures are useful, but the measured change in the drag force may not coincide with the actual endpoint on the workpiece because the interface between different films may not be at the endpoint. In such applications the workpiece is over-polished after the endpoint signal based on an empirically determined over-polish period. This method may not precisely and accurately terminate the planarizing cycle at the actual endpoint because differences in the workpieces, condition of the planarizing pad, and other factors that occur throughout a run of workpieces can affect the over-polish period. Therefore, such friction-based endpoint procedures may have only limited utility in many applications.

Still another method for estimating the endpoint involves monitoring changes in reflectance as different materials become exposed at the surface of the workpiece. For example, U.S. Pat. No. 5,433,651 issued to Lustig et al. ("Lustig") discloses an in-situ chemical-mechanical polishing machine for monitoring the polishing process during a planarizing cycle. The polishing machine has a rotatable polishing table including an embedded window and a planarizing pad with an aperture aligned with the window. The window is positioned at a location over which the workpiece can pass for in-situ viewing of a polishing surface of the workpiece from beneath the polishing table. The planarizing machine also includes a device for measuring a reflectance signal representative of an in-situ reflectance of the polishing surface of the workpiece. Lustig discloses terminating a planarizing cycle at the interface between two layers based on the different reflectances of the materials.

Although the apparatus disclosed in Lustig is an improvement over other abrasive endpointing techniques, it merely provides an indication of when a difference in film type occurs at the surface of the workpiece. The endpoint, however, may not coincide with a change in film type at the surface of the workpiece. As such, this process may work well in some applications, but in other applications the complexity of the processes may prevent such reflectance measurements from accurately endpointing abrasive processes.

One application that is advancing beyond the capabilities of existing endpointing techniques is forming polysilicon contacts in an array. In a typical polysilicon process, the endpoint is detected at a transition from removing only polysilicon to removing polysilicon and nitride. The endpoint signal produced by conventional reflectance-based tools is actually the point at which the nitride begins to be removed, but this typically occurs well before the actual endpoint is achieved. In CMP processes, for example, the optical- or friction-based endpoint techniques can indicate an endpoint at approximately 35 seconds, but in practice an over-polish period of approximately 70 seconds is required to reach the actual endpoint. As a result, conventional endpointing techniques merely provide a pseudo endpoint indication that requires a fixed over-polish time to reach the final endpoint.

Even this result, however, may not be accurate because changes in the workpieces or polishing conditions may render the over-polish period inaccurate.

Another challenging application for endpointing is stop-on-nitride planarization in which excess oxide is removed from an array until upper portions of a nitride layer are exposed. Planarization processes typically use a procedure that indicates when the upper portions of the nitride layer are exposed to endpoint this process. At the indicated endpoint, however, the wafers typically have some residual oxide over the nitride array. Conventional processes for stop-on-nitride applications accordingly over-polish the workpieces to reach a final endpoint. The workpieces can further be measured in the periphery to determine a change in the over-polish stage of the process, but this measurement merely assesses the extent of dishing in the periphery instead of the actual removal of material over the arrays on a workpiece. As a result, any changes in the heights of features could result in different thickness measurements in the periphery and thus poor process adjustments. The adjustments made to the over-polish period to achieve the required thickness may thus cause very high dishing because of undetected changes in the stack heights of the features.

Based on the foregoing, existing endpointing techniques may not provide an accurate indication of the true endpoint in many applications. Therefore, it would be desirable to provide methods and apparatus that can identify the actual endpoints or otherwise provide information on the actual status of the surface of the workpiece to improve the efficiency and efficacy of abrasive removal processes.

DETAILED DESCRIPTION

A. Overview

Figure 1:
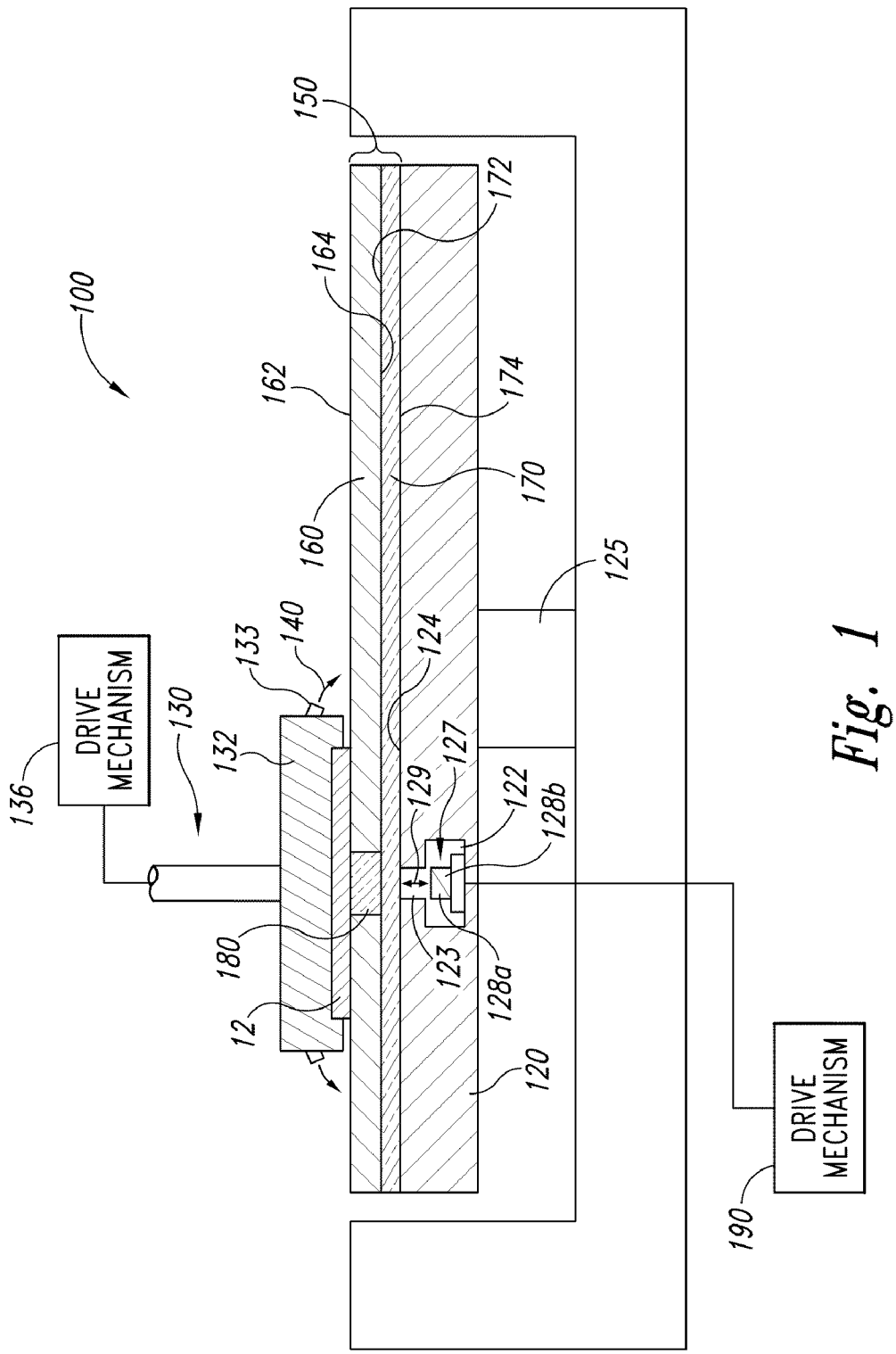
FIG. 1 is a cross-sectional view schematically illustrating an abrasive processing machine in accordance with an embodiment of the invention.

One aspect of the invention is directed toward methods for controlling the abrasive removal of material from a microfeature workpiece. An embodiment of such a method comprises irradiating a periodic structure of the workpiece and obtaining an intensity distribution of radiation returning from the periodic structure. The workpiece can be irradiated with a wide spectrum of wavelengths (e.g., white light). The intensity distribution can be an image or other signal from which a dimension or other physical parameter of the periodic structure can be determined. For example, the intensity distribution can be an intensity signal of radiation returning from the workpiece in a selected bandwidth (e.g., 200 nm-900 nm) or an image of a diffraction pattern of radiation that has been scattered by the periodic structure. The method further includes outputting a control signal based on the obtained intensity distribution. For example, the control signal can be an endpoint signal indicating the actual endpoint of the abrasive removal process.

Another embodiment of a method in accordance with the invention can further include outputting the control signal by ascertaining a critical dimension of the periodic structure using the obtained intensity distribution, and generating an endpoint signal when the critical dimension indicates that exposed surfaces of the periodic structure are at a desired endpoint for the abrasive removal process. When the periodic structure comprises conductive elements within an array area of a workpiece, the method can generate an endpoint signal when the critical dimension indicates that exposed surfaces of the conductive elements have a desired length and/or width; this can also be used to determine the extent to which the conductive elements are recessed relative to an exposed surface of a dielectric material between the conductive elements. The conductive elements, for example, can be polysilicon contacts or conductive lines. In another application in which the periodic structure comprises nitride elements separated by an oxide, the method can include determining a width of the nitride elements at a surface of the workpiece according to the intensity distribution of radiation returning from the workpiece. This particular embodiment can further include generating an endpoint signal when the determined width of the nitride elements indicates that the nitride elements are adequately exposed through the oxide.

Another embodiment of a method for removing material from microfeature workpieces in accordance with the invention comprises rubbing the workpiece against an abrasive medium and obtaining a spectral response corresponding to a dimension of a feature of the workpiece during a removal cycle. This embodiment can further include ascertaining a critical dimension of the feature using the obtained spectral response, and outputting a status signal indicative of a current status of a surface of the workpiece. The feature, for example, can comprise a periodic structure, and outputting a status signal can further comprise generating an endpoint signal when the dimension indicates that exposed surfaces of the periodic structure are at a desired endpoint.

Another aspect of the invention is directed toward tools or machines for abrasively removing material from microfeature workpieces. One embodiment of such a tool comprises an abrasive medium and a workpiece holder configured to hold the workpiece in contact with the abrasive medium. At least one of the abrasive medium and the workpiece holder moves to abrade material from the workpiece. The tool can further comprise a radiation source configured to irradiate a periodic structure on the workpiece and a detector configured to obtain an intensity distribution of radiation returning from the periodic structure. The radiation source and detector are configured such that a dimension or other physical parameter of the periodic structure can be determined from the intensity distribution of the radiation returning from the periodic structure. This tool can further include a controller having a computer-operable medium containing instructions that output a control signal based on the obtained intensity distribution.

Another embodiment of an apparatus for removing material from microfeature workpieces comprises a support, a polishing pad on the support, and a workpiece holder. At least one of the polishing pad and the workpiece holder are movable to rub the workpiece and/or the polishing pad relative to the other. The apparatus further includes a radiation source, a detector, and a controller. The radiation source is configured to irradiate a periodic structure of the workpiece while the workpiece holder presses the workpiece against the polishing pad, and the detector is configured to obtain an intensity distribution of radiation returning from the periodic structure such that a dimension or other physical parameter of the periodic structure can be determined from the intensity distribution. The controller includes a computer-operable medium containing instructions that output an endpoint signal to terminate removal of material when the intensity distribution corresponds to a parameter of the periodic structure at a desired endpoint.

Many specific details of particular embodiments are set forth in the following description and FIGS. 1-8 to provide a thorough understanding of these embodiments. The invention, however, may have additional embodiments that lack some of the details set forth in the detailed description or include additional structures or processes. For example, the following detailed description describes several embodiments of the invention in the context of chemical-mechanical planarization, but the invention is equally applicable to mechanical planarization, polishing, backgrinding, or other abrasive removal processes used in manufacturing microfeature devices. Therefore, a person skilled in the art will understand that the present invention may have other embodiments in addition to or in lieu of the specific embodiments described below in Sections B and C.

B. Embodiments of Abrasive Removal Machines

FIG. 1 is a cross-sectional view schematically illustrating a machine 100 for abrasively removing material from microfeature workpieces in accordance with one embodiment of the invention. In this embodiment, the machine 100 has a table or platen 120 with a cavity 122, a support surface 124, and an opening 123 at the support surface 124. The machine 100 also has a drive mechanism 125 to move the platen 120 and an optical system 127 in the cavity 122 that rotates with the platen 120. In alternative embodiments, the optical system 127 is outside of the platen 120 such that it is stationary and does not rotate with the platen 120. The optical system 127 includes a radiation source 128a that projects a radiation beam 129 through the opening 123 and a detector 128b that receives radiation returning from a workpiece 12 through the opening 123. The optical system 127 can be a broad band light source and spectrophotometer or other instrument that is capable of providing an intensity distribution or other type of data from which a dimension or other physical parameter of a periodic structure on the workpiece 12 can be determined.

The machine 100 can also include a carrier assembly 130 having a head 132 coupled to a drive mechanism 136. The head 132 holds and controls the workpiece 12 during a removal cycle. The head 132 can also include a number of nozzles 133 for dispensing a planarizing solution 140 onto a polishing pad 150. The polishing pad 150 comprises a planarizing member 160, a backing member 170, and a lens or optically transmissive window 180. The planarizing member 160 can be an abrasive or a non-abrasive body having a planarizing surface 162 and a backside 164. For example, an abrasive planarizing member 160 can have a resin binder and a plurality of abrasive particles fixedly attached to the resin binder. The planarizing member 160 can accordingly define a planarizing medium that removes material from the surface of the workpiece 12. In another embodiment, the planarizing solution 140 and the planarizing member 160 in combination define a planarizing medium.

The backing member 170 can be an optically transmissive sheet having a top surface 172 and a bottom surface 174. The top surface 172 is adhered to the backside 164 of the planarizing member 160, and the bottom surface 174 is adhered to the support surface 124 of the platen 120. The backing member 170, for example, can be a continuous sheet of polyester (e.g., optically transmissive Mylar®) or polycarbonate (e.g., Lexan®). In this embodiment, the backing member 170 protects the optical system 127 from being affected by the planarizing solution 140 or debris generated in the abrasive removal process. In an alternative embodiment shown in FIG. 2, the backing member 170 does not need to be optically transmissive, but rather the backing member 170 can have a hole aligned with the window 180.

Figure 2:
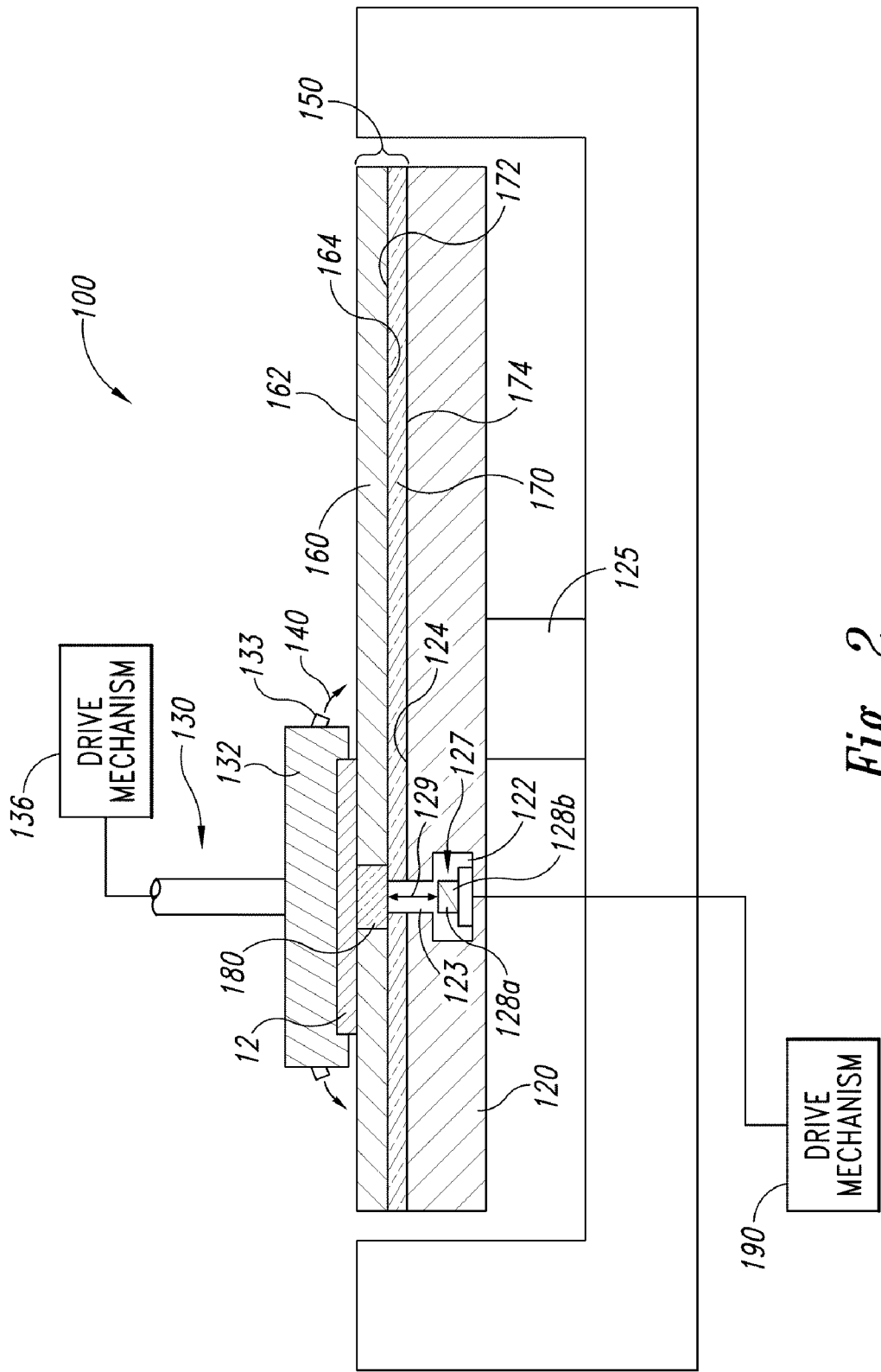
FIG. 2 is a cross-sectional view schematically illustrating an abrasive processing machine in accordance with another embodiment of the invention.

Referring to FIGS. 1 and 2 together, the machine 100 further includes a controller 190 coupled to the optical system 127 for controlling one or more aspects of the abrasive removal process. The controller 190 includes a computer-operable medium with instructions that cause the controller 190 to output a control signal based upon the intensity distribution obtained by the detector 128b. In many applications, the radiation source 128a illuminates periodic structures on the workpiece 12 as the periodic structures pass over the window 180 and the detector 128b detects radiation returning from the periodic structures to obtain the intensity distribution of the return radiation. The instructions of the computer-operable medium can further cause the controller to ascertain a dimension or other physical parameter of the periodic structures using the obtained intensity distribution. In one embodiment, a spectral intensity distribution of white light returning from the workpiece is used to determine the dimension or other physical parameter by (a) inputting the intensities at vectors of selected wavelengths into a partial least squares (PLS) calculation and/or (b) determining a model intensity distribution having an adequate fit with the obtained intensity distribution. The instructions of the computer-operable medium can also cause the controller 190 to generate an endpoint signal when the computed dimension indicates that exposed surfaces of the periodic structure are at a desired endpoint. Unlike conventional endpointing techniques based upon the reflectance of light from the workpiece, the computer-operable medium of the controller 190 and the intensity distribution of return radiation attained by the optical system 127 are configured to determine a critical dimension and/or another physical parameter correlated to the periodic structure as material is removed from the workpiece. For example, the computer-operable medium and the optical system 127 can be configured to cause the controller 190 to generate an endpoint signal when the computed dimension indicates that exposed surfaces of the periodic structure are recessed relative to an exposed surface of a dielectric material by a desired extent and/or when exposed surfaces of elements of the periodic structure have a width corresponding to the desired critical dimension of the periodic structure at the endpoint. Additional aspects of the controller 190 and the optical system 127 are described in more detail below.

Figure 3:
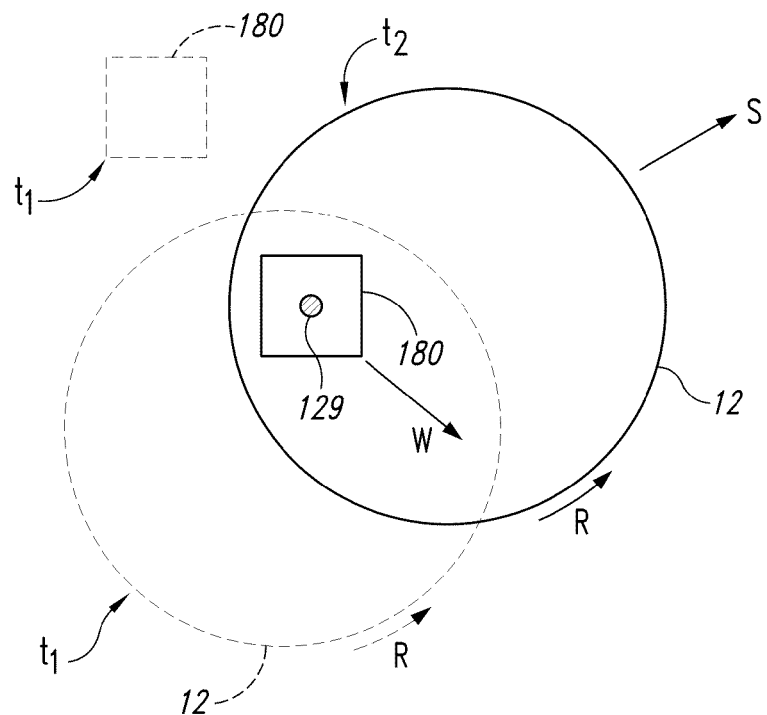
FIG. 3 is a schematic illustration of obtaining an intensity distribution from a periodic structure while the workpiece is under process in accordance with an embodiment of the invention.

FIG. 3 is a schematic view illustrating one method of obtaining an intensity distribution of radiation returning from a periodic structure of the workpiece 12 while the workpiece 12 is under process. At a first point in time $t_1$ (shown in broken lines), the workpiece 12 and the window 180 are not aligned such that no signal is sent to the controller 190 (FIG. 1). The workpiece 12 rotates (arrow R) and sweeps (arrow S) across the surface of the planarizing member 160 (FIG. 1), and the window 180 rotates (arrow W) with the rotation of the platen 120 (FIG. 1). As such, at a second time $t_2$, the workpiece 12 and the window 180 are aligned with each other such that the beam 129 can illuminate a portion of the workpiece 12. As the workpiece 12 and the window 180 continue to move, the beam 129 sweeps across a portion of the workpiece 12. The spectra of the radiation returning from the workpiece 12 will be different when it is measured over a periodic structure, such as an array, as material is removed from the workpiece 12. Thus, even though the workpiece 12 rotates and sweeps over the platen 120 at relatively high speeds, the difference in the spectra returning from periodic structures of the workpiece 12 can be identified. In some applications, such as scatterometry, one aspect of accurately measuring the intensity of radiation returning from the array areas is to provide a sufficiently small spot size of illumination for the beam 129. As such, unlike conventional optical endpoint systems that merely identify the interface between different films at the surface of the workpiece, the machine 100 is capable of monitoring changes in a critical dimension or another physical parameter of a periodic structure over time to provide a close relationship between a physical representation of the polishing process and the endpoint criteria.

In an alternative embodiment, the platen 120 and the workpiece 12 can be stopped during a removal cycle to measure the return spectra at a desired location on the workpiece 12 while the workpiece 12 remains on the planarizing member 160. After obtaining the measurement, the removal process can continue and additional measurements can be obtained periodically by stopping the platen 120 and/or the workpiece 12. This on-platen type of measurement is expected to be particularly useful for precisely and accurately measuring changes in a critical dimension of a periodic structure in an array area of a workpiece using scatterometry.

Figure 4:
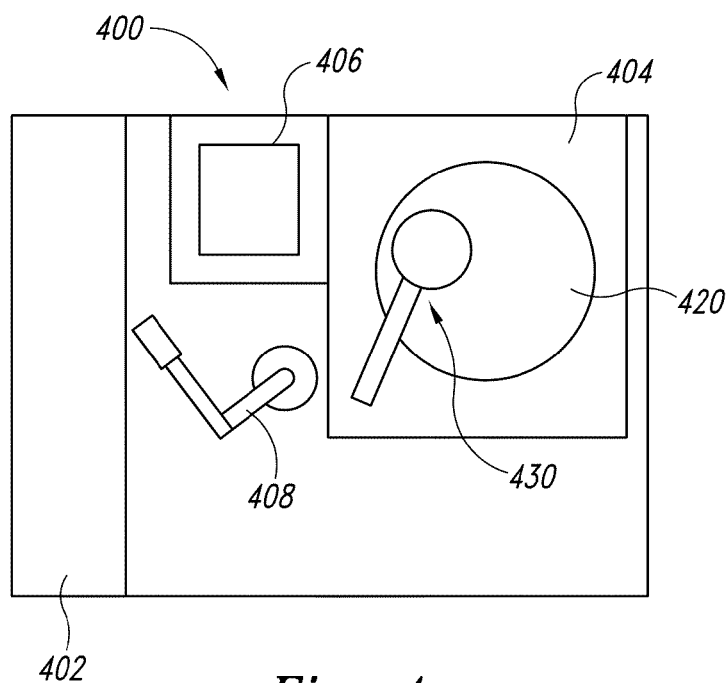
FIG. 4 is a top plan view of an abrasive processing tool in accordance with another embodiment of the invention.

FIG. 4 is a top plan view schematically illustrating a tool set 400 in accordance with another embodiment of the invention. The tool set 400 includes a load/unload station 402, a planarizing machine 404, a measurement station 406, and a handling device 408. The planarizing machine 404 can include a platen 420 and a carrier assembly 430. In operation, a workpiece is planarized on the planarizing machine 404, and then the handling device 408 transfers the workpiece to the measurement station 406. The measurement station 406 can be a broad band light source and spectrophotometer, scatterometer, or other device that can obtain an image or other type of intensity distribution from which a critical dimension or other physical parameter of a periodic structure on the workpiece can be determined. The tool set 400 accordingly provides in-line endpoint information that can be sent to a controller to provide feedback for adjusting the polishing parameters for subsequent wafers and/or repolishing the observed wafer.

Several of the foregoing embodiments enable the determination of a parameter, such as a critical dimension, of a periodic structure at the surface of the workpiece during a removal cycle. Unlike the known existing endpoint systems that use broad band wavelengths and a regression algorithm to minimize the error of a measured signal with a "golden" spectrum over time to control the removal process, several of the foregoing embodiments determine the critical dimension or other physical parameter of a periodic structure over time to control the removal process. This enables the controller to adjust parameters of the removal cycle to enhance the precision and accuracy of planarizing and polishing processes. For example, the additional information provided by obtaining an intensity distribution from which a dimension or other physical parameter of a periodic structure can be determined enables the controller to determine the actual endpoint at which the features of the periodic structure have a desired configuration at the surface of the workpiece. Therefore, several embodiments of the foregoing machines and tools are expected to enhance the performance of abrasive removal processes.

C. Embodiments of Methods for Controlling Abrasive Removal Processes

Another aspect of the invention is directed toward methods for removing materials from microfeature workpieces. Although the foregoing machines and tools can be used to implement several of the following methods, several examples of these methods can be performed on other types of equipment. For example, instead of a rotary chemical-mechanical planarization machine, several examples of these methods can be used on belt-type backgrinding machines and/or web-format planarization machines.

Figure 5:
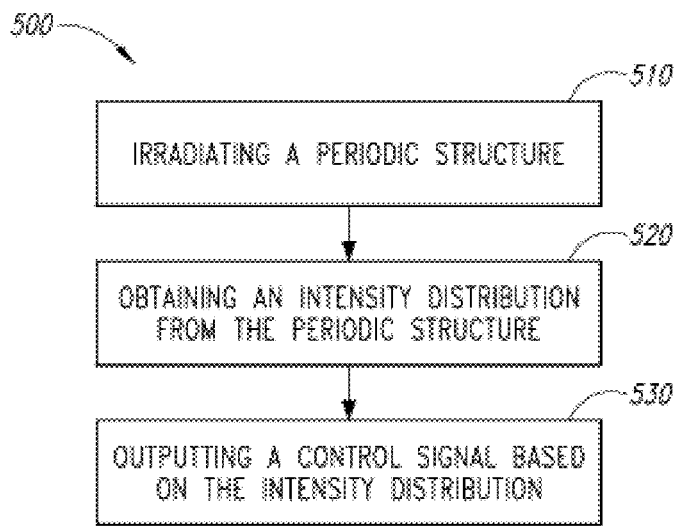
FIG. 5 is a flow chart illustrating a method in accordance with an embodiment of the invention.

FIG. 5 is a flow chart illustrating a method 500 in accordance with one embodiment of the invention. In this example, a first stage 510 includes irradiating a periodic structure on the workpiece and a second stage 520 includes obtaining an intensity distribution of radiation returning from the periodic structure. The intensity distribution obtained from the radiation returning from the workpiece provides the necessary data from which a dimension or other parameter of the periodic structure can be determined. In several examples of the method 500, a critical dimension or another parameter of the periodic structure is determined from the intensity distribution in real time during a removal cycle. The method 500 further has a third stage 530 that includes outputting a control signal based on the obtained intensity distribution. The control signal, for example, can be based on a computation that relates to a critical dimension or actually determines a critical dimension of the periodic structure. Each of the stages 510, 520 and 530 can have several different embodiments for executing the method 500.

The first stage 510, for example, can irradiate the workpiece with white light or other broad-band spectrums. The first stage 510 can include irradiating portions of the workpiece as it moves across the polishing pad as described above with reference to the polishing pad 150 and optical system 127. The workpiece is accordingly irradiated along paths in such cases. In other embodiments, the beam can irradiate stationary spots on the workpiece that are smaller than the surface area of the periodic structure. For example, the spot size of such a stationary measurement may be less than approximately 20-50 μm such that the illuminated area is contained within the periodic structure.

Figure 6:
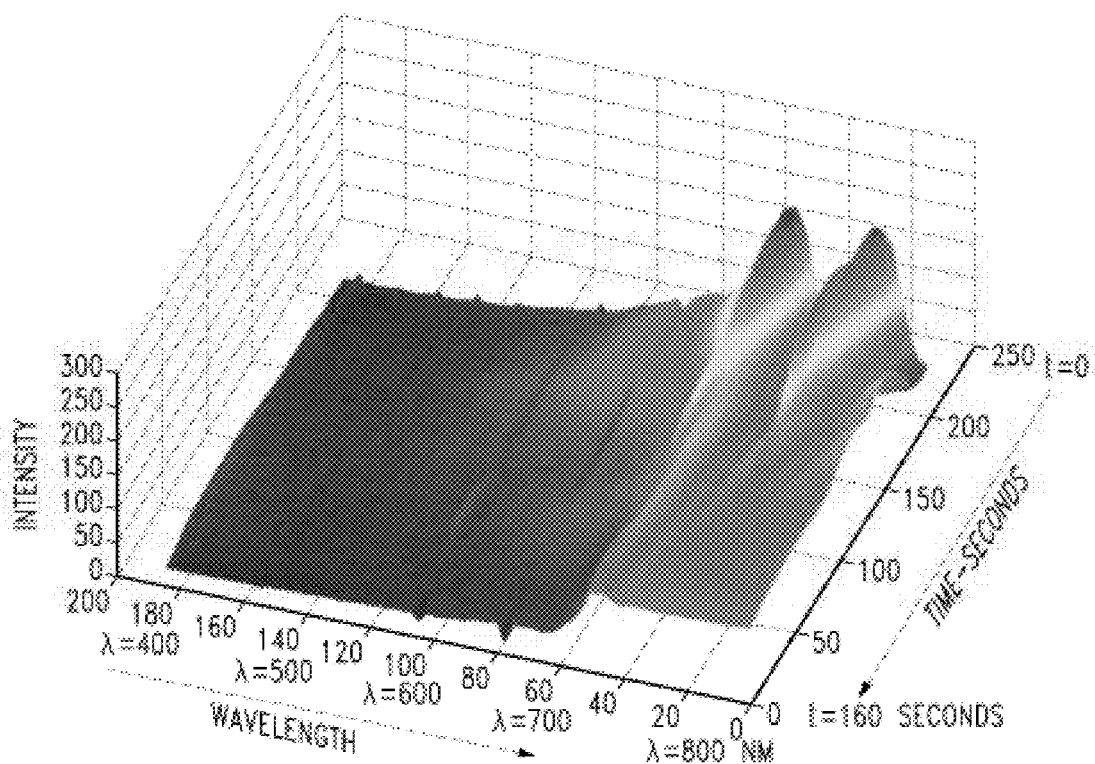
FIG. 6 is a graph illustrating an aspect of a stage in a method in accordance with an embodiment of the invention.

The second stage 520 of obtaining an intensity distribution from the periodic structure can provide a full spectrum of information from which a critical dimension or other parameter of the periodic structure can be determined. FIG. 6, for example, graphically illustrates an example of an intensity distribution 600 from which a dimension of a periodic structure can be determined. The intensity distribution 600 shows the intensity of radiation returning from the workpiece at different wavelengths along a timeline of the removal cycle. Different array areas or other periodic structures can have different spectral responses, and thus the second stage 520 can include obtaining an intensity distribution from several period structures across the workpiece. Other types of intensity distributions can be used in other embodiments of the method 500. For example, a diffraction pattern of radiation scattered from a periodic structure on the workpiece is another type of intensity distribution that can be obtained in the second stage 520.

The control signal output in the third stage 530 provides an indication of the status of removing material from a workpiece. The control signal, for example, can indicate the endpoint, provide a warning message of problems or unusual progress on a wafer, or provide other information. The controller 190 can generate the control signal by ascertaining a critical dimension based on (a) a predetermined relationship between critical dimensions of the periodic structure and intensities at selected wavelengths and/or (b) a model intensity distribution having an adequate fit with the obtained intensity distribution. As such, once a critical dimension or other parameter associated with the periodic structure is ascertained, then the state of the periodic structure at that point of the removal cycle is known.

Figure 7:
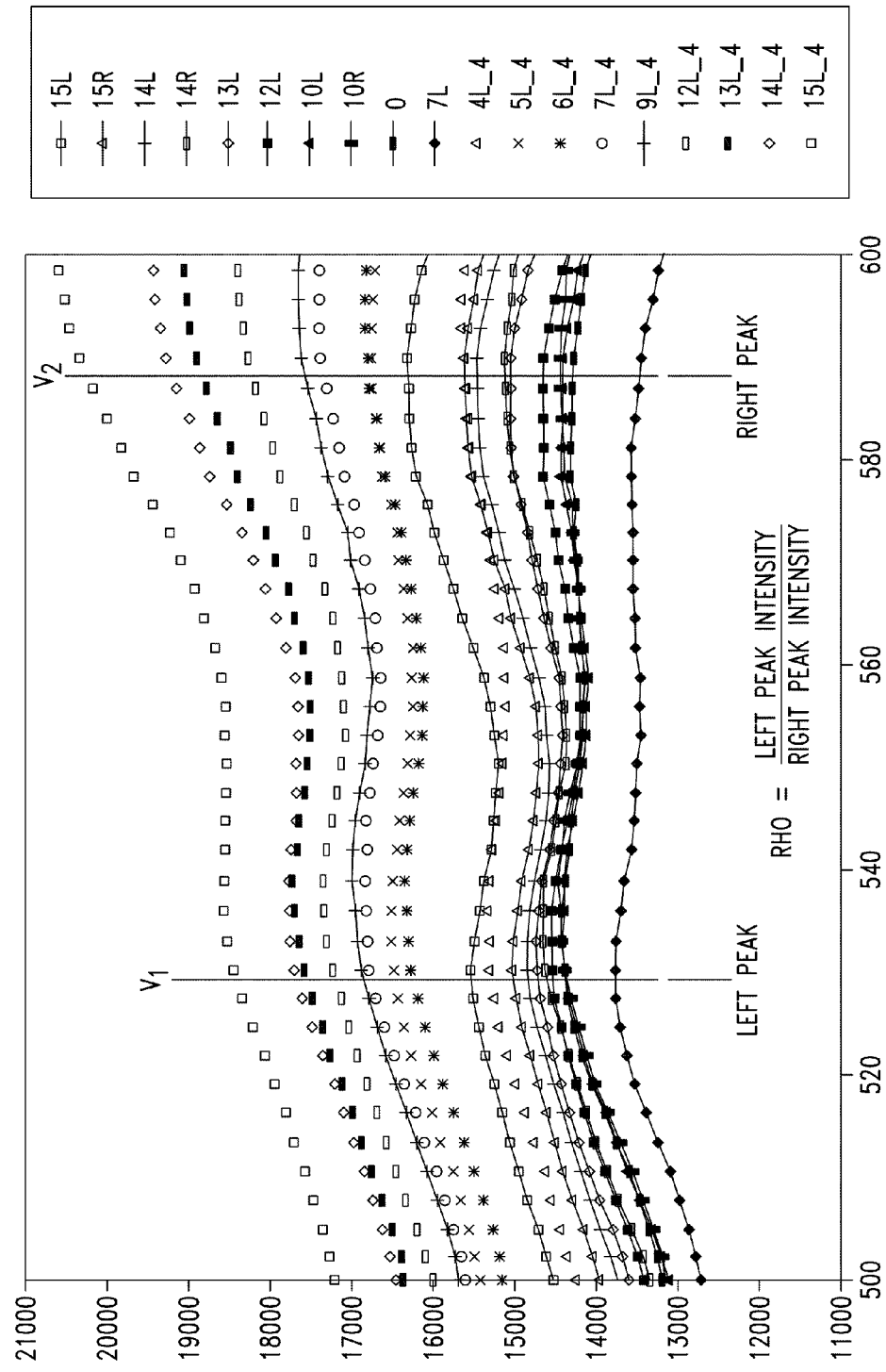
FIG. 7 is a graph illustrating another aspect of a stage of a method in accordance with an embodiment of the invention.

FIG. 7 is a graph illustrating a stage of a procedure for developing a relationship between a parameter of the periodic structure and intensity distribution so that a critical dimension or other parameter of the periodic structure can be ascertained accurately and quickly based on a measured intensity distribution. FIG. 7, more specifically, shows a plurality of intensity distributions of a test wafer in which the intensity distributions correspond to locations on the workpiece. The critical dimension of each corresponding location on the test wafer is measured using SEM or another suitable technique. Additionally, a plurality of vectors at specific wavelengths are selected and the intensity at each location of the wafer along the vector is stored. For example, a first vector $V_1$ near a first peak of approximately 530 nm and a second vector $V_2$ near a second peak of approximately 590 nm can be selected, and the intensities of the distributions along the vectors $V_1$ and $V_2$ can be associated with the measured critical dimensions of the corresponding locations. In practice, it is beneficial to use more than two vectors, and it may be desirable to obtain the intensity values of the locations along several hundred vectors.

Figure 8:
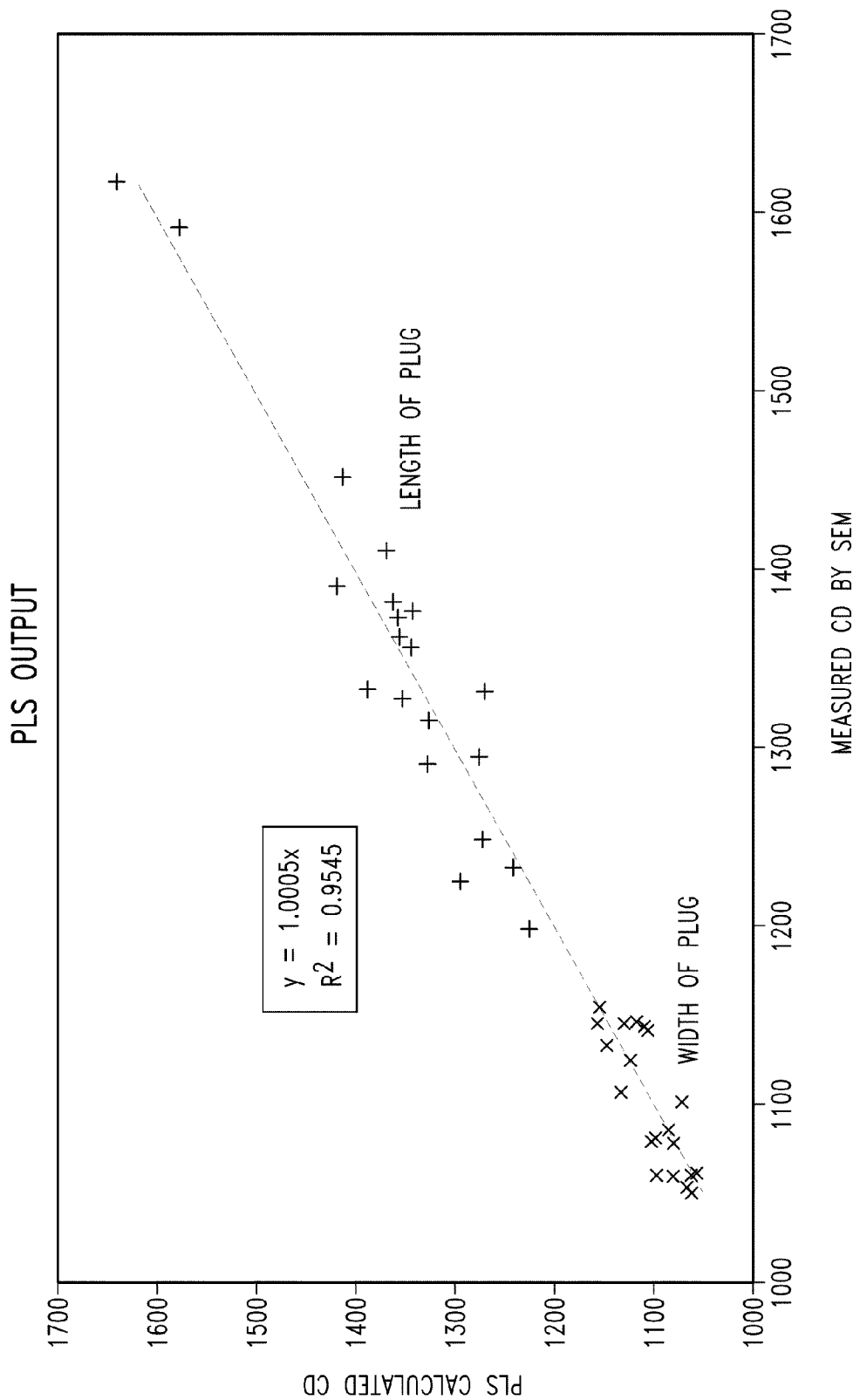
FIG. 8 is a graph illustrating an aspect of a stage of a method in accordance with yet another embodiment of the invention.

A matrix of intensity values and a matrix of corresponding critical dimensions can be derived from the vectors $V_1$ and $V_2$ shown in FIG. 7. Referring to FIGS. 7 and 8 together, the intensity values are determined by (a) selecting predictive vectors $V_1$ and $V_2$, (b) determining the intensity values along each vector for the individual locations, and (c) identifying the known critical dimension values (CD Values) at each location. Referring to vector $V_1$ in FIG. 7 at about 530 nm, for example, the critical dimensions and corresponding intensity values associated with vector $V_1$ can be associated with each other in a table. The critical dimensions and corresponding intensity values for vector $V_2$ shown in FIG. 7 can be similarly associated with each other in the table. The sets of intensity values and corresponding critical dimension values for the vectors can then be processed using a partial least squares (PLS) analysis or another suitable process to determine an output defining the relationship between the sets of intensity values at the vectored wavelengths and the critical dimensions.

The present inventors, in fact, have discovered that PLS models accurately predict the critical dimension for polysilicon CMP based on an intensity distribution of white light returning from a periodic structure during a removal cycle. FIG. 8 is a graph showing an example of the correlation between critical dimensions calculated using PLS in accordance with the invention and the actual critical dimensions measured by SEM. The critical dimension of polysilicon contacts can be determined in real time and in situ by (a) obtaining a intensity distribution of white light returning from a workpiece; (b) selecting a set of intensity values at the vectored wavelengths of the intensity distribution; (c) processing the set of intensity values using a PLS analysis to determine a PLS output; and (d) inputting the PLS output into a predetermined relationship between the critical dimensions and PLS outputs to determine the critical dimension of the periodic structure at that point of the removal cycle. As explained above, the computer-operable medium can then cause the controller to output a control signal based on the value of the critical dimension.

The values and descriptive vectors shown and described with reference to FIGS. 7 and 8 are merely one example of implementing the method 500. The actual values will vary for different periodic structures and different types of products. As such, different types of wafers will have different intensity values, descriptive vectors, and PLS/dimension relationships.

Several embodiments of the foregoing methods and machines for abrasively removing material from a microfeature workpiece are expected to improve the precision and accuracy of terminating abrasive removal processes at the desired endpoint. More specifically, the foregoing methods can assess the actual state of the surface of the workpiece as it is being processed and/or between processing cycles because the controller outputs control signals based upon a critical dimension or other physical parameter of a periodic structure on the workpiece. By continually, or at least periodically, determining a critical dimension or other physical parameter associated with the desired endpoint, the control signals are based upon the actual surface condition of the workpiece at each measurement time. This differs from existing reflectance endpointing techniques that determine the error between an obtained reflectance and a known or modeled reflectance at the desired endpoint because calculating the error does not provide any information regarding the surface of the workpiece until a minimum error is ascertained. The endpoint signal can accordingly correspond to the state of the critical dimension at the actual endpoint of the process.

Several embodiments of the foregoing methods and machines can also compensate for differences in the workpieces and process conditions to better endpoint abrasive removal processes. Because the actual state of a critical dimension is ascertained during processing or between processing cycles, the actual endpoint can still be achieved even when there are differences in the workpieces or changes in the process conditions. This is expected to reduce errors in polishing workpieces that are caused by such changes.

From the foregoing, it will be appreciated that specific embodiments of the invention have been described herein for purposes of illustration, but that various modifications may be made without deviating from the spirit and scope of the invention. For example, the methods and machines can have configurations and stages other than those shown in the Figures, and aspects of certain embodiments described above may be combined or eliminated in other embodiments. Also, although the intensity distribution of radiation returning from the workpiece is such that a dimension or other parameter of the periodic structure can be determined, several examples of methods in accordance with the invention do not necessarily determine an actual dimension or other parameter of the periodic structure. Accordingly, the invention is not limited except as by the appended claims.

We claim:

1. A method of polishing a semiconductor wafer having a periodic structure at least proximate to a surface of the semiconductor wafer, comprising:
   contacting the surface of the semiconductor wafer with a polishing pad;
   illuminating the periodic structure at the surface of the semiconductor wafer while the surface of the semiconductor wafer is in contact with the polishing pad;
   detecting reflected radiation returning from the periodic structure of the semiconductor wafer;
   determining a dimension of the periodic structure based on an intensity distribution of the reflected radiation; and outputting a control signal based on the dimension of the periodic structure.

2. The method of claim 1 wherein:
the periodic structure comprises conductive elements within an array area of the semiconductor wafer, the conductive elements being separated from one another by a dielectric material;
illuminating the periodic structure includes illuminating the periodic structure at the surface of the semiconductor wafer with a white light while the surface of the semiconductor wafer is in contact with the polishing pad;
determining a dimension of the periodic structure includes:
selecting a vector at a specific wavelength;
detecting intensities of the reflected radiation along the vector;
correlating the detected intensities to the dimension of the periodic structure at the surface of the semiconductor wafer;
outputting a control signal further comprises:
monitoring the dimension of the periodic structure over a period of time using the obtained intensity distribution; and
generating an endpoint signal when the dimension indicates that exposed surfaces of the conductive elements are recessed relative to an exposed surface of the dielectric material.

3. The method of claim 1 wherein:
the periodic structure comprises polysilicon contacts separated by a dielectric material;
outputting a control signal further comprises:
determining a difference in elevation between exposed surfaces of the polysilicon contacts and an exposed surface of the dielectric material based on a model intensity distribution and the intensity distribution of the reflected radiation; and
generating an endpoint signal when the determined difference in height indicates that the exposed surfaces of the polysilicon contacts are recessed relative to the exposed surface of the dielectric material.

4. The method of claim 1 wherein:
the periodic structure comprises nitride elements separated by an oxide;
outputting a control signal further comprises:
determining a width of the nitride elements based on the intensity distribution of the reflected radiation according to a predetermined relationship between the width of the nitride elements and the intensity distribution; and
generating an endpoint signal when the determined width indicates that the nitride elements are adequately exposed through the oxide.

5. The method of claim 1 wherein detecting a reflected radiation includes imaging a diffraction pattern of radiation scattered from the periodic structure.

6. The method of claim 1 wherein determining a dimension of the periodic structure includes correlating the intensity distribution of the reflected radiation to the dimension of the periodic structure based on a predetermined relationship between the intensity distribution and the dimension of the periodic structure.

7. The method of claim 1 wherein determining a dimension of the periodic structure includes matching the intensity distribution of the reflected radiation to a predetermined model of the intensity distribution and the dimension of the periodic structure.

8. The method of claim 1 wherein determining a dimension of the periodic structure includes:

acquiring a set of intensity values at a set of wavelengths from the intensity distribution of the reflected radiation; and
determining the dimension of the periodic structure based on a predetermined linear relationship between the intensity values and the dimension of the periodic structure.

9. The method of claim 1 wherein detecting a reflected radiation includes detecting radiation returning from only the periodic structure at the surface of the semiconductor wafer.

10. The method of claim 1 wherein determining a dimension of the periodic structure includes:
selecting a plurality of vectors at specific wavelengths;
detecting intensities of the reflected radiation along the vectors; and
correlating the detected intensities to the dimension of the periodic structure at the surface of the semiconductor wafer.

11. A method of polishing a semiconductor wafer having a periodic structure at least proximate to a surface of the semiconductor wafer, comprising:
removing material from the surface of the semiconductor wafer with an abrasive medium;
irradiating the surface of the semiconductor wafer while removing material from the surface of the semiconductor wafer;
detecting radiation returning from the periodic structure of the semiconductor wafer;
monitoring a physical dimension of the periodic structure based on a correlation between the physical dimension of the periodic structure and an intensity distribution of the detected radiation; and
outputting a control signal when the dimension of the periodic structure has a predetermined value.

12. The method of claim 11 wherein monitoring a physical dimension includes calculating the physical dimension of the periodic structure based on the correlation between the physical dimension of the periodic structure and an intensity distribution of the detected radiation.

13. The method of claim 11 wherein monitoring a physical dimension includes calculating the physical dimension of the periodic structure based on the correlation between the physical dimension of the periodic structure and an intensity distribution of the detected radiation, the correlation being generally linear.

14. The method of claim 11 wherein monitoring a physical dimension includes calculating the physical dimension of the periodic structure based on the correlation between the physical dimension of the periodic structure and an intensity distribution of the detected radiation at a set of preselected wavelengths.

15. The method of claim 11 wherein monitoring a physical dimension includes:
selecting a wavelength,
obtaining intensities of the detected radiation at the selected wavelength; and
calculating the physical dimension of the periodic structure by correlating the obtained intensities of the detected radiation to the physical dimension of the periodic structure.

16. The method of claim 11 wherein monitoring a physical dimension includes calculating the physical dimension of the periodic structure based on the correlation between the physical dimension of the periodic structure and an intensity distribution of the detected radiation, and wherein the method further includes calculating a change in the physical dimension as material is removed from the surface of the semiconductor wafer.

17. The method of claim 11 wherein monitoring a physical dimension includes calculating the physical dimension of the periodic structure based on the correlation between the physical dimension of the periodic structure and an intensity distribution of the detected radiation, the physical dimension includes at least one of a width, a depth, and a length of the individual periodic structure.

18. A method of polishing a semiconductor wafer, comprising:
   irradiating a periodic structure on a surface of the semiconductor wafer;
   obtaining an intensity distribution of radiation returning from the periodic structure;
   calculating a physical dimension of the periodic structure based on the obtained intensity distribution; and
   outputting a control signal based on the calculated dimension of the periodic structure.

19. The method of claim 18 wherein calculating a physical dimension includes calculating the physical dimension of the periodic structure based on the obtained intensity distribution and a predetermined relationship between the physical dimension and the intensity distribution of the radiation returning from the periodic structure.

20. The method of claim 18 wherein calculating a physical dimension includes correlating the obtained intensity distribution to the physical dimension based on a predetermined relationship between the physical dimension and the intensity distribution of the radiation returning from the periodic structure.

21. The method of claim 18, further comprising:
   monitoring the calculated dimension of the periodic structure over a period of time; and
   generating an endpoint signal when the calculated dimension indicates that a desired physical dimension of the periodic structure is achieved.

22. The method of claim 18 wherein irradiating the periodic structure comprises impinging a beam against the periodic structure at an altitude angle and obtaining the intensity distribution comprises imaging a diffraction pattern of radiation scattered from the periodic structure.

* * * * *